United States Patent
Qvortrup et al.

(10) Patent No.: US 7,129,872 B1
(45) Date of Patent: Oct. 31, 2006

(54) AUDIO SIGNAL ANALOG-TO-DIGITAL CONVERTER UTILIZING A TRANSFORMED-BASED INPUT CIRCUIT

(75) Inventors: Peter Qvortrup, Hove (GB); Andrew B. Grove, Hove (GB)

(73) Assignee: Audio Note UK Ltd., East Sussex (GB)

( * ) Notice: Subject to any disclaimer, the term of this patent is extended or adjusted under 35 U.S.C. 154(b) by 0 days.

(21) Appl. No.: 11/137,043

(22) Filed: May 25, 2005

(51) Int. Cl.
*H03M 1/62* (2006.01)

(52) U.S. Cl. ...................................... 341/139; 341/133

(58) Field of Classification Search ........ 341/110–172, 341/177; 330/10, 51, 251
See application file for complete search history.

(56) References Cited

U.S. PATENT DOCUMENTS

| | | | | |
|---|---|---|---|---|
| 2,248,462 A * | 7/1941 | Pollack | ...... | 332/154 |
| 2,576,145 A * | 11/1951 | Rudkin | ...... | 330/65 |
| 3,771,040 A | 11/1973 | Fletcher et al. | ...... | 321/2 |
| 3,965,447 A | 6/1976 | Thomas | ...... | 333/80 |
| 4,089,049 A * | 5/1978 | Suzuki et al. | ...... | 363/17 |
| 4,228,493 A | 10/1980 | De Sartre et al. | ...... | 363/56 |
| 4,322,786 A * | 3/1982 | Weber | ...... | 363/21.05 |
| 4,567,608 A * | 1/1986 | Watson et al. | ...... | 381/122 |
| 4,746,897 A | 5/1988 | Shuey | ...... | 340/310 |
| 4,771,422 A * | 9/1988 | Hauer | ...... | 370/359 |
| 5,103,188 A | 4/1992 | Bender | ...... | 330/265 |
| 5,331,533 A | 7/1994 | Smith | ...... | 363/20 |
| 5,488,552 A | 1/1996 | Sakamoto et al. | ...... | 363/21 |
| 5,612,647 A | 3/1997 | Malec | ...... | 330/146 |
| 5,646,602 A | 7/1997 | Gertz et al. | ...... | 340/825.25 |
| 5,696,441 A | 12/1997 | Mak et al. | ...... | 324/115 |
| 5,867,016 A * | 2/1999 | Baur et al. | ...... | 323/319 |
| 5,959,371 A | 9/1999 | Dooley et al. | ...... | 307/130 |
| 5,986,498 A * | 11/1999 | Rodriguez | ...... | 330/10 |
| 6,144,258 A | 11/2000 | Schwenk | ...... | 330/296 |
| 6,175,255 B1 | 1/2001 | Mohan | ...... | 327/108 |
| 6,191,568 B1 | 2/2001 | Poletti | ...... | 323/268 |
| 6,263,015 B1 | 7/2001 | Awata et al. | ...... | 375/216 |
| 6,282,042 B1 * | 8/2001 | Hana et al. | ...... | 360/64 |
| 6,452,398 B1 * | 9/2002 | Libove et al. | ...... | 324/457 |

(Continued)

FOREIGN PATENT DOCUMENTS

GB    2 270 595    3/1994

OTHER PUBLICATIONS

Carter, et al., "Amplifiers and Bits: An Introduction to Selecting Amplifiers for Data Converters", Dec. 2001.

(Continued)

*Primary Examiner*—Linh Nguyen
(74) *Attorney, Agent, or Firm*—Gordon & Jacobson, P.C.

(57) ABSTRACT

An apparatus for converting an input analog audio signal into digital form including an analog-to-digital converter. An amplifier circuit and step-down transformer provide an interface for the input analog audio signal to the analog-to-digital converter. The step-down transformer includes a primary winding operably coupled to the amplifier circuit and a secondary winding operably coupled to the analog-to-digital converter. The amplifier circuit drives the primary winding with the input analog audio signal (or an amplified version thereof). The step-down transformer generates a stepped-down representation of the input analog audio signal at its secondary winding. Advantageously, the step-down transformer lowers the effective output impedance of the amplifier circuit, which reduces distortion in the audio analog input signal supplied to the analog-to-digital converter. In addition, the step-down transformer reduces (by the factor 1/N) the demand placed on amplifier circuit in charging a sampling capacitor typically realized as part of the input stage of the analog-to-digital-converter.

22 Claims, 7 Drawing Sheets

U.S. PATENT DOCUMENTS 6,496,059 B1 * 12/2002 Nguyen ........................ 330/10
2005/0104760 A1 * 5/2005 Pentakota .................... 341/154
2005/0197791 A1 * 9/2005 Matsumoto .................. 702/60

OTHER PUBLICATIONS

Kugelstadt, "Switched-Capacitor ADC Analog Input Calculations", Sep. 1998.

"Basic Valve Amplifier Circuits", downloaded on Nov. 13, 2002.

"Digital Audio Basics", downloaded on Nov. 19, 2002.

Analog Devices, "12-Bit, 105 MSPS/125 MSPS IF Sampling A/D Converter", 2001, no month.

* cited by examiner

AUDIO SIGNAL ANALOG-TO-DIGITAL CONVERTER UTILIZING A TRANSFORMED-BASED INPUT CIRCUIT

BACKGROUND OF THE INVENTION

1. Field of the Invention

This invention relates broadly to analog-to-digital converters. More particularly, this invention relates to analog-to-digital converters that store an analog input signal voltage level on one or more capacitive circuit elements.

2. State of the Art

Figure 1:
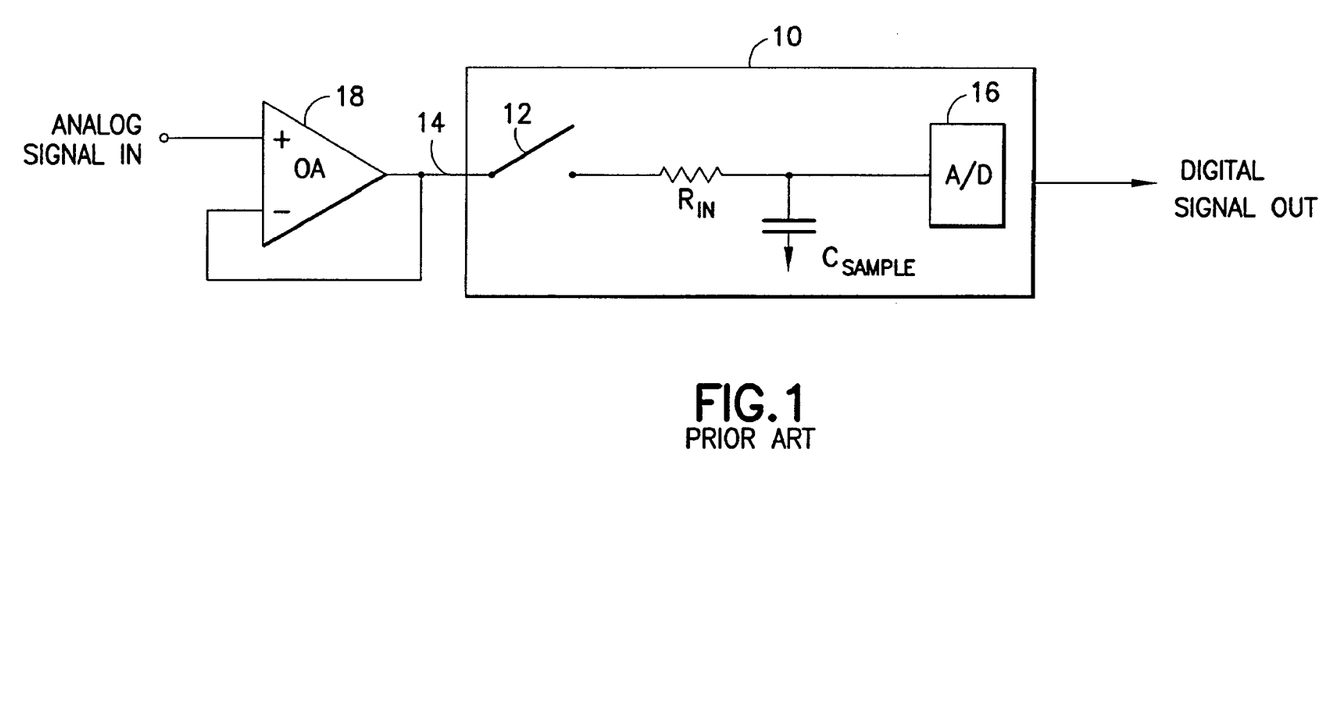
FIG. 1 is a schematic diagram illustrating a prior art mechanism for converting an analog input signal into digital form.

As shown in FIG. 1, an analog-to-digital converter 10 typically includes a sample-and-hold input stage that utilizes a switch 12 to selectively couple a sampling capacitor $C_{sample}$ to the input 14, which allows the sampling capacitor $C_{sample}$ to charge to an analog voltage level that corresponds to the analog voltage level at the input 14. The switch 12 is opened and analog-to-digital conversion circuitry 16 converts the analog voltage level stored on the sampling capacitor $C_{sample}$ to a sequence of digital words (each word being one or more bits) corresponding thereto. As is well known in the electronic arts, there are many different architectures that may be used to implement the analog-to-digital conversion process carried out by the converter 16, including voltage-scaling converters, charge-scaling converters, successive-approximation converters, flash-type converters, sigma-delta converters, etc. The suitability of a given approach is dependent upon the desired resolution (e.g., number of bits) of the conversion process and the frequency of the signal that is converted.

Conventionally, an operational amplifier buffer 18 is used to charge the sampling capacitor $C_{sample}$ to an analog voltage level that corresponds to the analog voltage level at the input 14. This configuration is shown in FIG. 1. The output impedance of the operational amplifier 18 together with the sampling capacitor $C_{sample}$ cause a lagging phase shift. This phase shift, together with the operational amplifier's internal phase shifts and high feedback ratio, causes undesired instability and/or ringing. Such instability and/or ringing is exacerbated by the fact that the sampling capacitor $C_{sample}$ is switchably coupled to the output of the operational amplifier 18 at the sampling rate of the analog-to-digital converter 16 (or a multiple thereof). In audio applications, such instability and/or ringing distorts the audio input signal and subsequent analog-to-digital conversion process, which is typically most evident at high audio frequencies.

In addition, any "real world" operational amplifier will have an input offset voltage error (typically due to internal device mismatches or other circuit imbalances). Such input offset voltage errors, if significant, will make the operational amplifier 18 unsuitable for use in multi-bit analog-to-digital conversion operations. Moreover, "real world" operational amplifiers with low input offset voltage errors generally have insufficient slew rates to achieve low distortion at high audio frequencies.

Thus, there is a need in the art to provide improved circuitry that converts an analog audio signal into digital form in a manner that reduces distortion in the conversion process.

SUMMARY OF THE INVENTION

It is therefore an object of the invention to provide improved circuitry for converting an analog audio signal into digital form in a manner that reduces distortion in the conversion process.

It is another object of the invention to provide improved circuitry for converting an analog audio signal into digital form in a manner that reduces distortion for high frequency components in the analog audio signal.

It is a further object of the invention to provide improved circuitry for converting an analog audio signal into digital form in a manner that does not require negative feedback, thereby providing for improved stability and reduced distortion in the conversion process.

It is also an object of the invention to provide improved circuitry for converting an analog audio signal into digital form in a manner that provides for DC isolation between drive circuitry and the input stage of an analog-to-digital converter.

In accord with these objects, which will be discussed in detail below, an apparatus for converting an input analog audio signal into digital form includes an analog-to-digital converter; and an amplifier circuit and step-down transformer which provide an interface for the input analog audio signal to the analog-to-digital converter. The step-down transformer includes a primary winding operably coupled to the amplifier circuit and a secondary winding operably coupled to the analog-to-digital converter. The amplifier circuit drives the primary winding with the input analog audio signal (or an amplified version thereof). The step-down transformer generates a stepped-down representation of the input analog audio signal at its secondary winding.

It will be appreciated that the step-down transformer lowers the effective output impedance of the amplifier circuit, which reduces distortion in the audio analog input signal supplied to the analog-to-digital converter. In addition, the step-down transformer reduces (by the factor 1/N) the demand placed on the amplifier circuit in charging a sampling capacitor typically realized as part of the input stage of the analog-to-digital-converter.

According to one embodiment of the invention, the amplifier circuit is realized by one or more thermionic valves (such as a triode or pentode). Preferably, the one or more thermionic valves are configured as an inverting amplifier or follow amplifier that drives the primary winding of the transformer.

According to another embodiment of the invention, the amplifier circuit is realized by one or more active transistor devices (such as a bipolar transistor, JFET transistor, or MOSFET transistor). Preferably, the one or more active transistor devices are configured as an inverting amplifier or follow amplifier that drives the primary winding of the transformer.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 2:
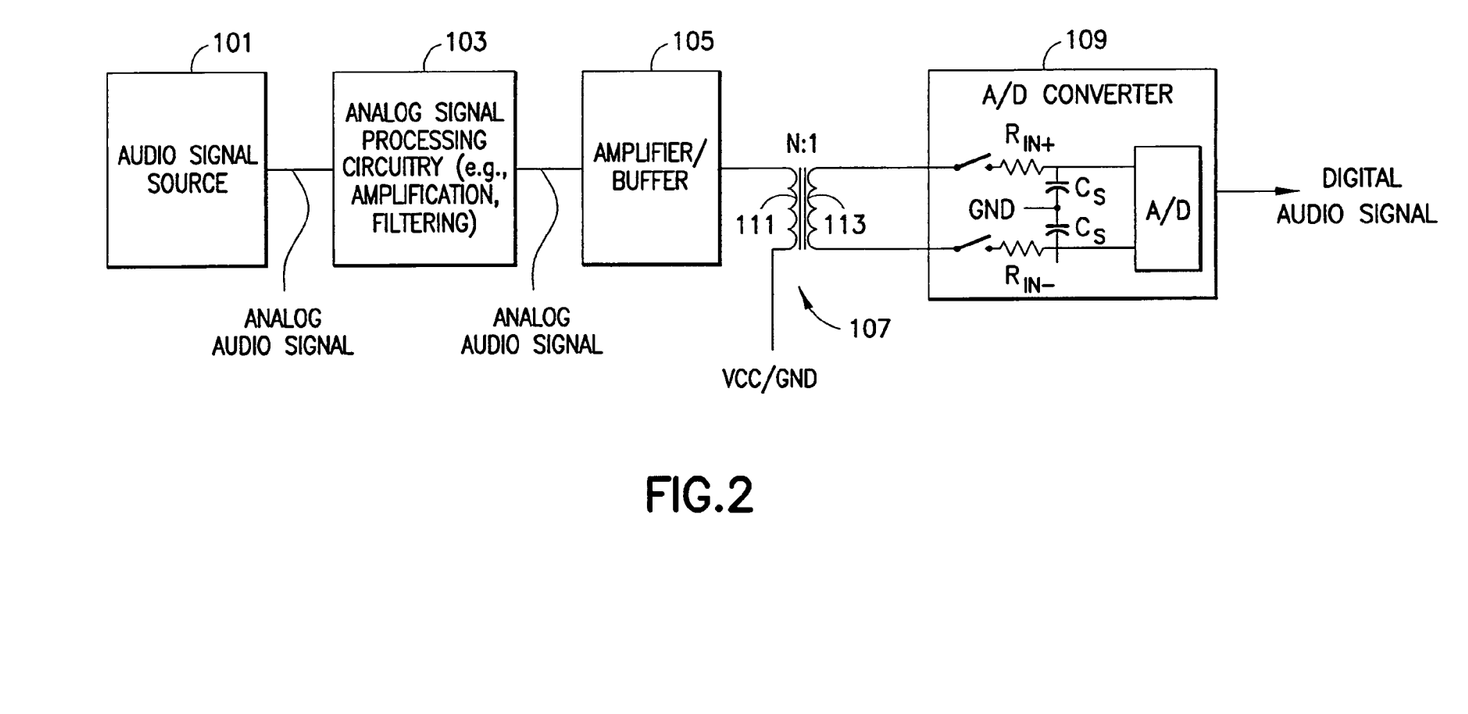
FIG. 2 is a schematic diagram illustrating a system that generates an analog audio signal and converts the analog audio signal into digital form in accordance with the present invention.

Turning now to FIG. 2, there is shown improved circuitry for converting an analog audio signal to a corresponding digital audio signal. The analog audio signal is generated by an audio signal source 101 (such as a turntable using a moving coil cartridge or a magnetic coil cartridge, a tape player utilizing magnetic tape, a microphone, or a musical instrument). Analog signal processing circuitry 103 may be operably coupled to the output of the audio signal source in order to filter and/or amplify the analog audio signal produced therefrom. An amplifier/buffer circuit 105 and step-down transformer 107 provides an interface for the input analog audio signal (provided by the audio signal source 101, or the analog signal processing circuitry 103 as shown) to an analog-to-digital converter 109.

The buffer/amplifier circuitry 105 drives the primary winding 111 of the transformer 107 with the analog audio signal supplied thereto (or an amplified version thereof). The transformer 107 generates a stepped-down representation of the analog audio signal at its secondary winding 113. This stepped-down signal represents the voltage level of input analog audio signal stepped-down by a factor of (1/N). This factor is dictated by the ratio of the number of turns of the secondary winding 113 relative to the number of turns of the primary winding 111. This ratio may be any convenient value. It should be appreciated that larger step down ratios decrease the effective impedance at the transformer output terminals as described below in more detail. The signal generated by the secondary winding 113 of the transformer 107 is supplied to the input stage of the analog-to-digital converter 109, which stores a sample of the signal on the sampling capacitance (the two capacitors labeled '$C_s$') for subsequent conversion into digital form. Preferably, the input to the analog-to-digital converter 109 is a differential signal derived from opposite ends of the secondary winding 113 as shown. However, one skilled in the art will realize that a single-ended input derived from one of the ends the secondary winding 113 can be used as well.

The output of the analog-to-digital converter is a digital audio signal (e.g., sequence of digital words) representing the analog audio signal samples stored on the sampling capacitance (the two capacitors labeled '$C_s$'). Typically, each digital word is on the order of 8 to 20 bits. As set forth above, there are many different architectures that may be used to implement the analog-to-digital conversion process carried out by the converter 109, including voltage-scaling converters, charge-scaling converters, successive-approximation converters, flash-type converters, sigma-delta converters, etc.

Advantageously, the step-down transformer 107 lowers the effective output impedance of the amplifier/buffer circuitry 105. This lower output impedance decreases the phase shift attributable to the output impedance and sampling capacitance, thereby reducing distortion in the audio analog input signal supplied to the analog-to-digital converter 109. Note that negative feedback can be used to lower the effective output impedance of the amplifier/buffer circuitry 105. However, such negative feedback may be unnecessary due to the lowering of the effective output impedance of the amplifier/buffer circuitry 105 provided by the transformer 107. In such configurations where negative feedback is omitted, the amplifier/buffer circuitry 105 is not slew-rate limited (e.g., a maximum rate at which the output voltage of the amplifier/buffer circuitry 105 can change with time), and has improved stability (because there is no risk of oscillation that stems from negative feedback).

The step-down transformer 107 also advantageously reduces (by the factor 1/N) the demand placed on the amplifier/buffer circuitry in charging the sampling capacitance. In addition, the DC isolation between the primary winding 111 and the secondary winding 113 ensures that any DC offset voltage of amplifier/buffer 105 does not propagate to the secondary winding 113 and then to the analog-to-digital converter 109, thereby reducing distortion in the audio analog input signal supplied to the analog-to-digital converter 109. Moreover, the transformer 107 preferably includes an electrostatic screen between the primary winding 111 and the secondary winding 113 to provide improved DC isolation therebetween.

Figure 3A:
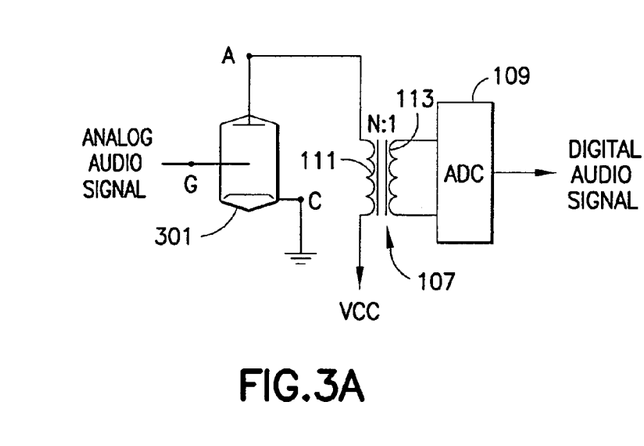
FIGS. 3A through 3N are schematic diagrams illustrating embodiments of the present invention that utilize different circuit elements (and various configurations of such circuit elements) to realize the amplifier/buffer circuitry and transformer of FIG. 2.
Figure 3B:
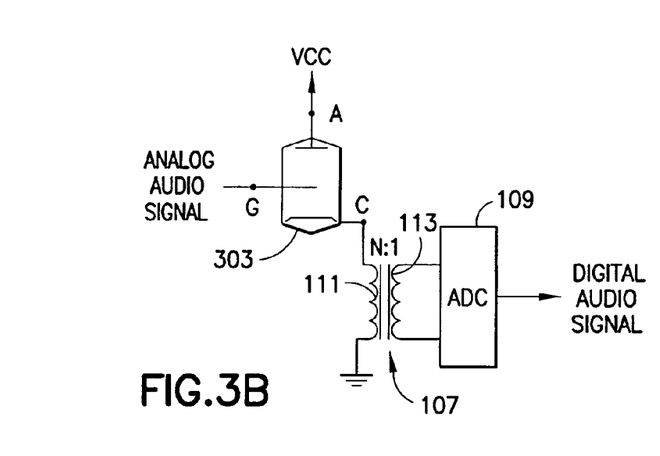
Figure 3C:
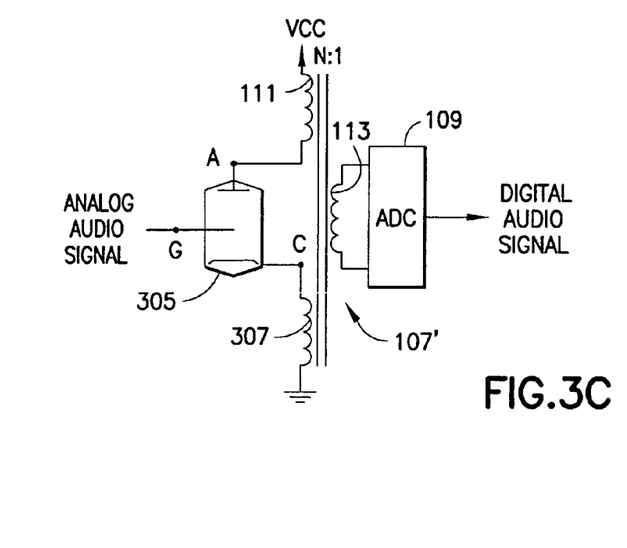
Figure 3D:
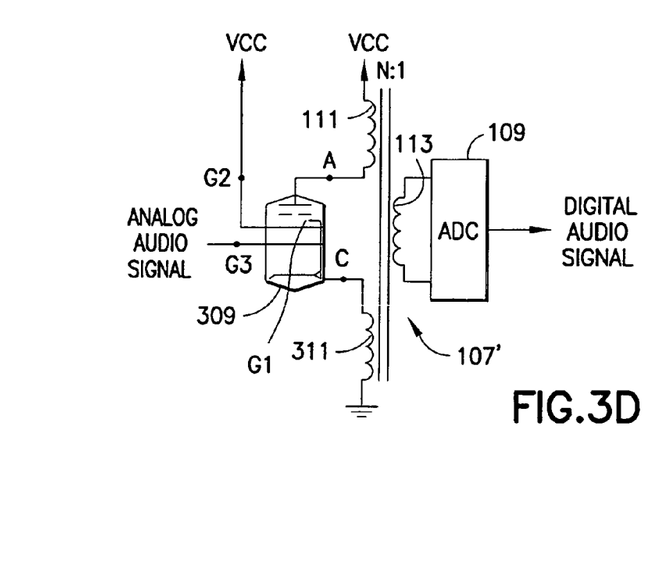
Figure 3E:
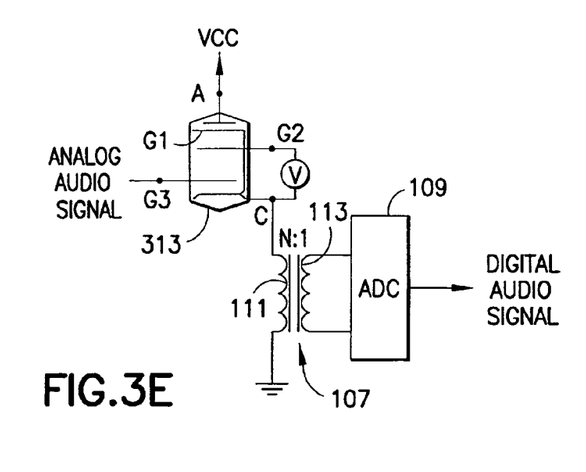
Figure 3F:
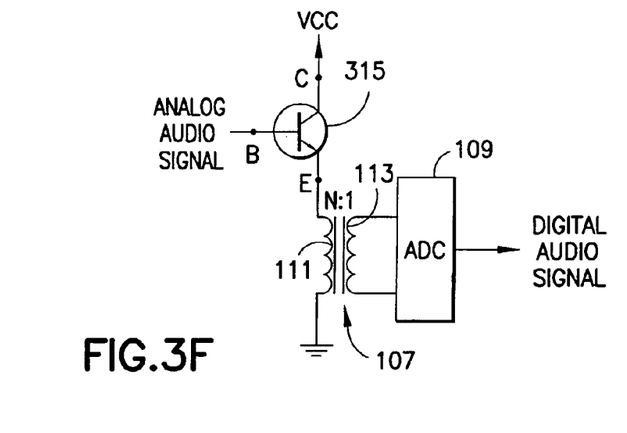
Figure 3G:
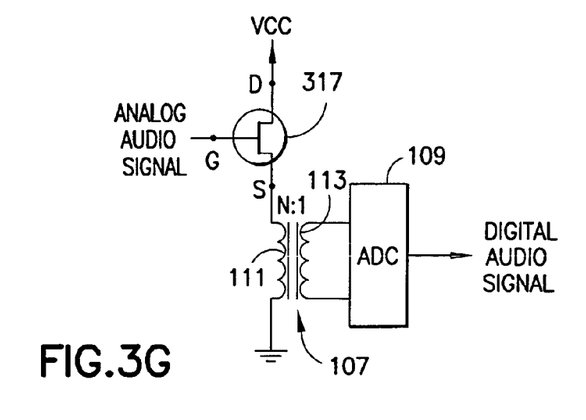
Figure 3H:
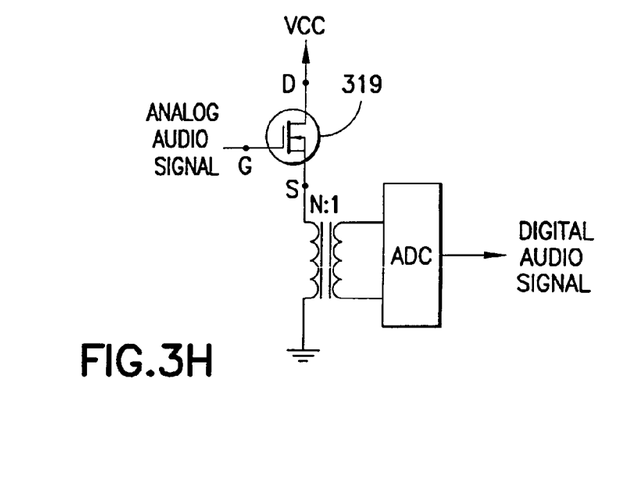
Figure 3I:
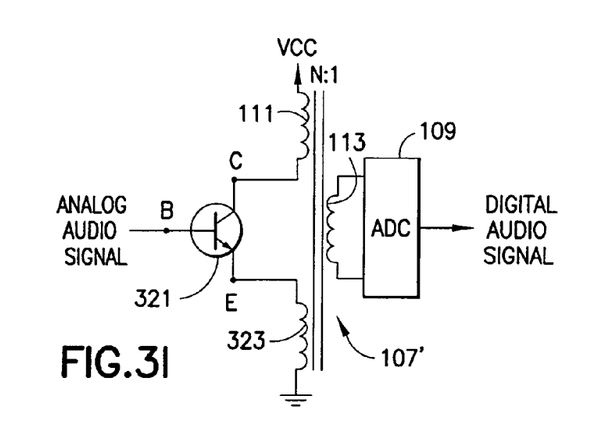
Figure 3J:
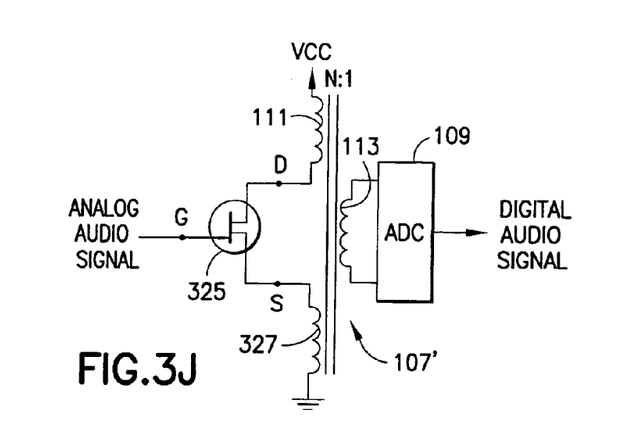
Figure 3K:
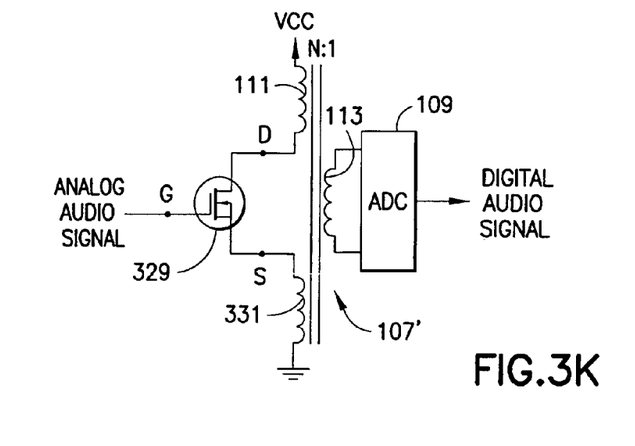
Figure 3L:
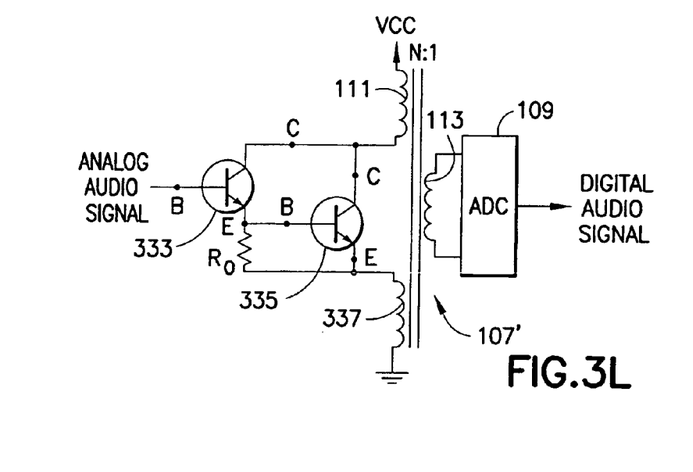
Figure 3M:
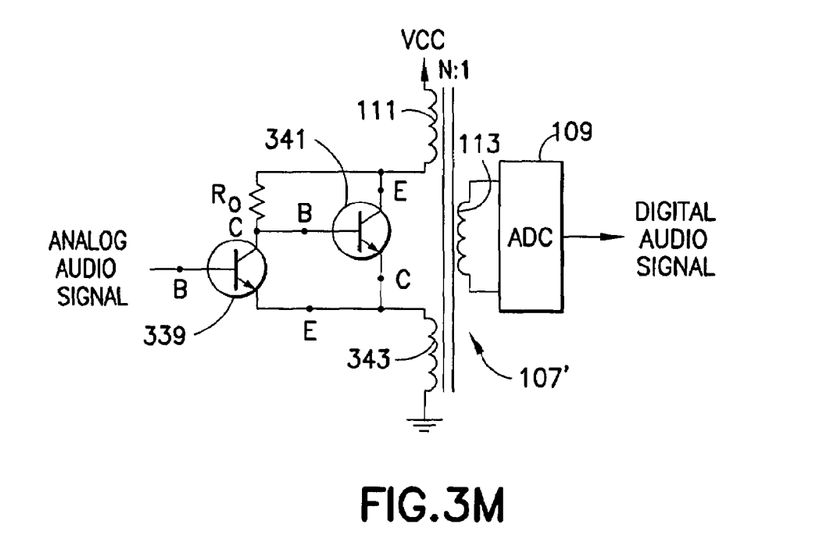
Figure 3N:
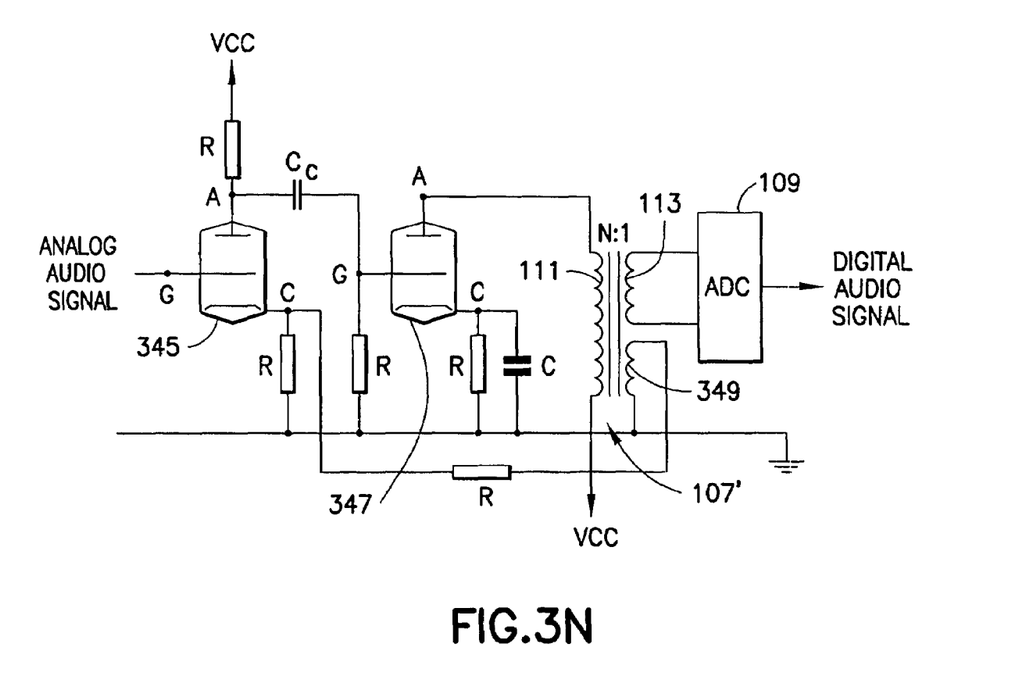

As shown in FIGS. 3A through 3N, there are many different types of circuit elements (including different types of thermionic valves and different types of active transistor devices) that can be used to realize the amplifier/buffer circuitry 105 of FIG. 2. One skilled in the art will realize that there are many variations on such designs and other designs not shown that can be used to realize the amplifier/buffer circuitry 105 of FIG. 2.

FIG. 3A illustrates a triode valve 301 configured as a common cathode amplifier. In this configuration, the input analog audio signal is supplied to the grid terminal (G), the cathode terminal (C) is coupled to ground potential, and the anode terminal (A) is coupled through the primary winding 111 of the step-down transformer 107 to a positive supply voltage ($V_{cc}$). The opposite ends of the secondary winding 113 of the step-down transformer 107 are used to provide a differential input to the analog-to-digital converter 109.

FIG. 3B illustrates a triode valve 303 configured as a common anode follower amplifier. In this configuration, the input analog audio signal is supplied to the grid terminal (G), the anode terminal (A) is coupled to a positive supply voltage ($V_{cc}$), and the cathode terminal (C) is coupled through the primary winding 111 of the step-down transformer 107 to ground potential. The opposite ends of the secondary winding 113 of the step-down transformer 107 are used to provide a differential input to the analog-to-digital converter 109. The triode-based follower configuration lowers the effective drive impedance to the transformer 107, which improves the low frequency performance of the transformer 107 as its primary inductance is in shunt with the drive circuit.

FIG. 3C illustrates a triode valve 305 configured as a common cathode amplifier in a manner similar to the configuration of FIG. 3A; however, the step-down transformer 107' includes a tertiary winding 307. One end of the tertiary winding 307 is coupled to ground potential, while the other end is coupled as a negative feedback signal path to the cathode terminal (C) of the triode valve 305. The negative feedback signal path lowers the effective output impedance and improves the frequency response of the triode-based amplifier circuit, and reduces harmonic distortion in the output signal produced at the anode terminal of the triode valve 305.

FIG. 3D illustrates a pentode valve 309 configured as a common cathode amplifier. In this configuration, the input analog audio signal is supplied to the third grid terminal (G3), the second grid terminal (G2) is coupled to a positive voltage supply ($V_{cc}$), and the anode terminal (A) is coupled through the primary winding 111 of the step-down transformer 107 to the positive supply voltage ($V_{cc}$). The step-down transformer 107' includes a tertiary winding 311. One end of the tertiary winding 311 is coupled to ground potential, while the other end is coupled as a negative feedback signal path to the cathode terminal (C) of the pentode valve 309. The negative feedback signal path lowers the effective output impedance and improves the frequency response of the pentode-based amplifier circuit, and reduces harmonic distortion in the output signal produced at the anode terminal of the pentode valve 309. The opposite ends of the secondary winding 113 of the step-down transformer 107 are used to provide a differential input to the analog-to-digital converter 109.

FIG. 3E illustrates a pentode valve 313 configured as a common anode follower amplifier. In this configuration, the input analog audio signal is supplied to the third grid terminal (G3), the second grid terminal (G2) is coupled through a voltage source (V) to the cathode terminal (C), the cathode terminal (C) is also coupled through the primary winding 111 of the step-down transformer 107 to ground potential, and the anode terminal (A) is coupled to a positive supply voltage ($V_{cc}$). The opposite ends of the secondary winding 113 of the step-down transformer 107 are used to provide a differential input to the analog-to-digital converter 109.

FIG. 3F illustrates a bipolar transistor 315 configured as a common collector follower amplifier. In this configuration, the input analog audio signal is supplied to the base terminal (B), the collector terminal (C) is coupled to a positive supply voltage ($V_{cc}$), and the emitter terminal (E) is also coupled through the primary winding 111 of the step-down transformer 107 to ground potential. The opposite ends of the secondary winding 113 of the step-down transformer 107 are used to provide a differential input to the analog-to-digital converter 109.

FIG. 3G illustrates a JFET transistor 317 configured as a common drain follower amplifier. In this configuration, the input analog audio signal is supplied to the gate terminal (G), the drain terminal (D) is coupled to a positive supply voltage ($V_{cc}$), and the source terminal (S) is also coupled through the primary winding 111 of the step-down transformer 107 to ground potential. The opposite ends of the secondary winding 113 of the step-down transformer 107 are used to provide a differential input to the analog-to-digital converter 109.

FIG. 3H illustrates a MOSFET transistor 319 configured as a common drain follower amplifier. In this configuration, the input analog audio signal is supplied to the gate terminal (G), the drain terminal (D) is coupled to a positive supply voltage ($V_{cc}$), and the source terminal (S) is also coupled through the primary winding 111 of the step-down transformer 107 to ground potential. The opposite ends of the secondary winding 113 of the step-down transformer 107 are used to provide a differential input to the analog-to-digital converter 109.

FIG. 3I illustrates a bipolar transistor 321 configured as an inverting amplifier. In this configuration, the input analog audio signal is supplied to the base terminal (B), and the cathode terminal (C) is coupled through the primary winding 111 of the step-down transformer 107 to a positive supply voltage ($V_{cc}$). The step-down transformer 107' includes a tertiary winding 323. One end of the tertiary winding 323 is coupled to ground potential, while the other end is coupled as a negative feedback signal path to the emitter terminal (E) of the bipolar transistor 321. The negative feedback signal path reduces the effective output impedance and improves the frequency response of the bipolar-based amplifier circuit, and reduces harmonic distortion in the output signal produced at the collector terminal of the bipolar transistor 321. The opposite ends of the secondary winding 113 of the step-down transformer 107 are used to provide a differential input to the analog-to-digital converter 109.

FIG. 3J illustrates a JFET transistor 325 configured as an inverting amplifier. In this configuration, the input analog audio signal is supplied to the gate terminal (G), and the drain terminal (D) is coupled through the primary winding 111 of the step-down transformer 107 to a positive supply voltage ($V_{cc}$). The step-down transformer 107' includes a tertiary winding 327. One end of the tertiary winding 327 is coupled to ground potential, while the other end is coupled as a negative feedback signal path to the source terminal (S) of the JFET transistor 325. The negative feedback signal path lowers the effective output impedance and improves the frequency response of the JFET-based amplifier circuit, and reduces harmonic distortion in the output signal produced at the drain terminal of the JFET transistor 325. The opposite ends of the secondary winding 113 of the step-down transformer 107 are used to provide a differential input to the analog-to-digital converter 109.

FIG. 3K illustrates a MOSFET transistor 329 configured as an inverting amplifier. In this configuration, the input analog audio signal is supplied to the gate terminal (G), and the drain terminal (D) is coupled through the primary winding 111 of the step-down transformer 107 to a positive supply voltage ($V_{cc}$). The step-down transformer 107' includes a tertiary winding 331. One end of the tertiary winding 331 is coupled to ground potential, while the other end is coupled as a negative feedback signal path to the source terminal (S) of the MOSFET transistor 329. The negative feedback signal path lowers the effective output impedance and improves the frequency response of the MOSFET-based amplifier circuit and reduces harmonic distortion in the output signal produced at the drain terminal of the MOSFET transistor 329. The opposite ends of the secondary winding 113 of the step-down transformer 107 are used to provide a differential input to the analog-to-digital converter 109.

FIG. 3L illustrates bipolar transistors 333,335 configured as a Darlington-pair inverting amplifier. In this configuration, the input analog audio signal is supplied to the base terminal (B) of one transistor 333 of the Darlington-pair, the emitter terminals (E) of the Darlington pair are coupled through the tertiary winding 337 of the step-down transformed 107' to ground potential, and the collector terminals (C) of the Darlington-pair are coupled through the primary winding 11 of the step-down transformer 107' to a positive supply voltage ($V_{cc}$). The tertiary winding 337 provides a negative feedback signal path to the emitter terminals (E) of the Darlington-pair. The negative feedback signal path lowers the effective output impedance and improves the frequency response of the Darlington-pair-based amplifier circuit, and reduces harmonic distortion in the output signal produced at the collector terminals of the Darlington-pair. The opposite ends of the secondary winding 113 of the step-down transformer 107 are used to provide a differential input to the analog-to-digital converter 109.

FIG. 3M illustrates bipolar transistors 339,341 configured as a compound-pair inverting amplifier. In this configuration, the input analog audio signal is supplied to the base terminal (B) of one transistor 339 of the compound-pair, the emitter terminal (E) of the one transistor 339 and the collector terminal (C) of the other transistor 341 are coupled through a tertiary winding 343 of the step down transformer 107' to ground potential, and the collector terminal (C) of the one transistor 339 and the emitter terminal (E) of the other transistor 341 are coupled through the primary winding 111 of the step-down transformer 107' to a positive supply voltage ($V_{cc}$). The tertiary winding 337 provides a negative feedback signal path to the first-stage emitter and second-stage collector terminal of the compound pair. The negative feedback signal path lowers the effective output impedance and improves the frequency response of the compound-pair-based amplifier circuit, and reduces harmonic distortion in the output signal produced at the first-stage collector terminal and second-stage emitter terminal of the compound pair. The opposite ends of the secondary winding 113 of the step-down transformer 107 are used to provide a differential input to the analog-to-digital converter 109.

FIG. 3N illustrates a two stage triode amplifier including triode valves 345 and 347. In this configuration, the input analog audio signal is supplied to the grid terminal (G) of the triode valve 345 of the first stage, the anode terminal (A) of the first stage triode valve 345 is coupled through a bias resistor to a positive voltage supply ($V_{cc}$), and the cathode terminal (C) of the first-stage triode valve 345 is coupled through a bias resistor to ground potential. The grid terminal (G) of the triode valve 347 of the second stage is coupled via coupling capacitor $C_c$ (for DC isolation between stages) to the anode terminal (A) of the first-stage triode valve 345, and is also coupled through a bias resistor to ground potential. The cathode terminal (C) of the second-stage triode valve 347 is coupled through and R-C network to ground potential. The anode terminal (A) of the second-stage triode valve 347 is coupled through the primary winding 111 of the step-down transformer 107' to a positive supply voltage ($V_{cc}$). The step-down transformer 107' includes a tertiary winding 349. One end of the tertiary winding 349 is coupled to ground potential, while the other end is coupled as a negative feedback signal path through bias resistance to the cathode terminal (C) of the first-stage triode valve 345. The negative feedback signal path lowers the effective output impedance and improves the frequency response of the triode-based amplifier circuit, and reduces harmonic distortion in the output signal produced at the anode terminal (A) of the second-stage triode valve 347. The opposite ends of the secondary winding 113 of the step-down transformer 107' are used to provide a differential input to the analog-to-digital converter 109.

Figure 4A:
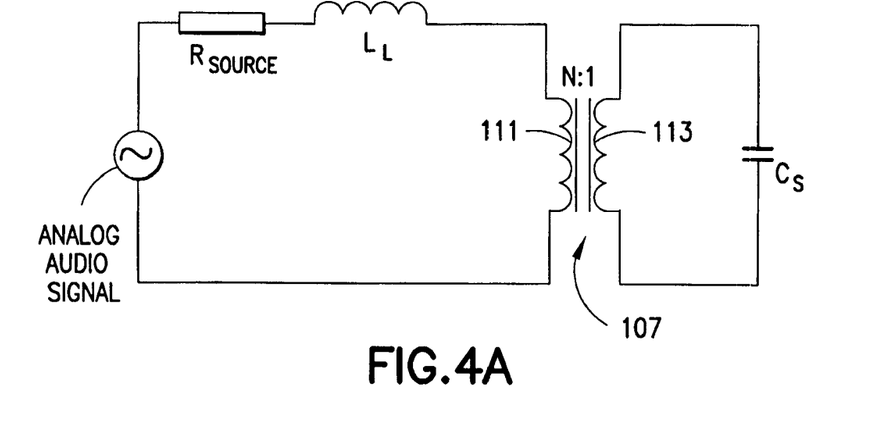
FIG. 4A is a two-port circuit model that describes the functionality provided by the embodiments of the buffer/amplifier circuitry and step-down transformer shown in FIGS. 2 through 3N.

The functionality provided by the embodiments of the buffer/amplifier circuitry 105 and step-down transformer 107 described above may be described by the two-port circuit model shown in FIG. 4A. In this two-port circuit model, the output impedance of the buffer/amplifier circuitry 105 is labeled $R_{source}$. The leakage inductance from the primary winding 111 (and tertiary winding if used) to the secondary winding 113 of the transformer 107 is labeled $L_L$. The capacitance of the sampling capacitor of the analog-to-digital converter 109 is labeled $C_s$. The circuit model of FIG. 4A neglects the input resistance of the input stage of the analog-to-digital converter 109, which is typically small. The two-port circuit model of FIG. 4A can be translated into an equivalent circuit model shown in FIG. 4B. In this equivalent circuit model, the output impedance of the buffer/amplifier circuitry 105 is reduced by a factor of $(1/N^2)$ to provide an effective output impedance of $R_{source}/N^2$ and the leakage inductance is increased by a factor of $N^2$ to provide an effective leakage current of $L_L \cdot N^2$. From this equivalent circuit model, it is evident that the step-down transformer 107 lowers the effective output impedance of the amplifier/buffer circuitry 105. This lower output impedance decreases the phase shift attributable to the output impedance and sampling capacitor $C_s$, thereby reducing distortion in the audio analog input signal supplied to the analog-to-digital converter 109.

Figure 4B:
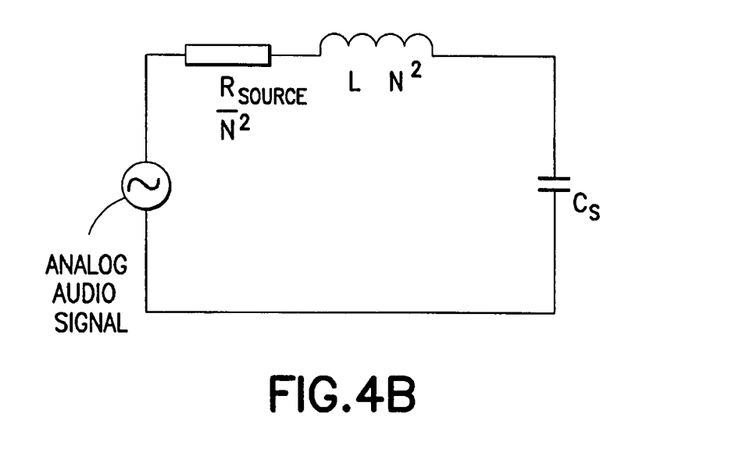
FIG. 4B is an equivalent circuit model that describes the functionality provided by the embodiments of the buffer/amplifier circuitry and step-down transformer shown in FIGS. 2 through 3N.

Note that the effective output impedance, effective leakage inductance, and the sampling capacitance form a second order low-pass filter. The Q of this filter can be tuned (preferably by adding inductive elements and/or resistance elements to the secondary loop between the secondary winding 113 and the sampling capacitor $C_s$) to have any value in reason. A commonly used Q is 0.577, which is a Bessel filter that has optimal phase response. A slightly lower Q of 0.5 gives better transient response. Of course, there are a wide variety of Q values which can be used, and the designer can select any desired value.

There have been described and illustrated herein several embodiments of an audio signal analog-to-digital converter utilizing a transformer-based input circuit. While particular embodiments of the invention have been described, it is not intended that the invention be limited thereto, as it is intended that the invention be as broad in scope as the art will allow and that the specification be read likewise. Thus, while particular thermionic devices and active transistor devices and circuit configurations have been disclosed, it will be appreciated that other thermionic devices and active transistor devices and circuit configurations can be used as well. For example, while it is preferred that the amplifier/buffer circuitry of the input circuit not employ feedback, it will be recognized that such feedback can be employed. Furthermore, it will be understood that the transformer of the input circuit can utilize a tertiary winding to provide such feedback. In this configuration, the feedback path is galvanically isolated from the secondary winding that interfaces directly to the analog-to-digital converter. Moreover, while particular configurations have been disclosed in reference to the second order filter provided by the input circuit, it will be appreciated that other configurations could be used as well. It will therefore be appreciated by those skilled in the art that yet other modifications could be made to the provided invention without deviating from its spirit and scope as claimed.

What is claimed is:

1. An apparatus for converting an input analog audio signal into digital form comprising:
    an analog-to-digital converter; and
    an amplifier circuit and step-down transformer that provide an interface for the input analog audio signal to said analog-to-digital converter, wherein the step-down transformer includes a primary winding operably coupled to said amplifier circuit and a secondary winding operably coupled to said analog-to-digital converter, and wherein said step-down transformer lowers an effective output impedance of said amplifier circuit.

2. An apparatus according to claim 1, wherein:
    said amplifier circuit is adapted to operate as a buffer amplifier that drives said primary winding with the input analog audio signal.

3. An apparatus according to claim 1, wherein:
    said amplifier circuit is adapted to operate as an amplifier that drives said primary winding with an amplified version of the input analog audio signal.

4. An apparatus according to claim 1, wherein:
said step-down transformer generates a stepped-down representation of the input analog audio signal at its secondary winding.

5. An apparatus according to claim 4, wherein:
said stepped-down signal represents a voltage level of input analog audio signal stepped down by a factor of (1/N) wherein said factor is dictated by the ratio of the number of turns of the secondary winding over the number of turns of the primary winding.

6. An apparatus according to claim 1, wherein:
a signal generated by the secondary winding of said transformer is supplied to an input stage of said analog-to-digital converter, wherein said input stage stores a sample of said signal on a sampling capacitor for subsequent conversion into digital form.

7. An apparatus according to claim 6, wherein:
a differential signal derived from opposite ends of said secondary winding is supplied to said input stage of said analog-to-digital converter.

8. An apparatus according to claim 1, wherein:
said analog-to-digital converter is one of a voltage-scaling converter, a charge-scaling converter, a successive-approximation converter, a flash-type converter, and a sigma-delta converter.

9. An apparatus according to claim 1, wherein:
said transformer includes an electrostatic screen between said primary winding and said secondary winding.

10. An apparatus according to claim 1, wherein:
said input analog audio signal is derived from an output of an analog audio signal source.

11. An apparatus according to claim 1, wherein:
said amplifier circuit comprises a thermionic valve.

12. An apparatus according to claim 11, wherein:
said thermionic valve comprises a triode valve configured as one of a common cathode amplifier and a common anode follower amplifier.

13. An apparatus according to claim 11, wherein:
said thermionic valve comprises a pentode valve configured as one of a common cathode amplifier and a common anode follower amplifier.

14. An apparatus according to claim 1, wherein:
said amplifier circuit comprises at least one active transistor device.

15. An apparatus according to claim 14, wherein:
said at least one active transistor device is selected from the group consisting of a bipolar transistor, a JFET transistor, and a MOSFET transistor.

16. An apparatus according to claim 14, wherein:
said at least one active transistor device is configured as one of a follower amplifier and an inverting amplifier.

17. An apparatus according to claim 14, wherein:
said at least one active transistor device comprises two bipolar transistors configured as a Darlington-pair inverting amplifier.

18. An apparatus according to claim 14, wherein:
said at least one active transistor device comprises two bipolar transistors configured as a compound-pair inverting amplifier.

19. An apparatus according to claim 1, wherein:
said amplifier circuit includes multiple amplifier stages.

20. An apparatus according to claim 19, wherein:
each one of said multiple amplifier stages includes a thermionic valve configured as an inverting amplifier.

21. An apparatus according to claim 1, wherein:
said transformer includes a tertiary winding that provides a negative feedback path to said amplifier circuit.

22. An apparatus according to claim 1, wherein:
said primary winding has first and second ends, said first end operably coupled to said amplifier circuit, and said second end operably coupled to a constant voltage potential source.

\* \* \* \* \*